Jan. 26, 1971 L. F. ROSSETTI, JR 3,558,423
LOW LOSS ELECTRICAL PRINTED CIRCUIT BOARD COMPRISING
POLYOLEFIN, FIBERGLASS AND METALLIC FOIL
Filed Oct. 16, 1967
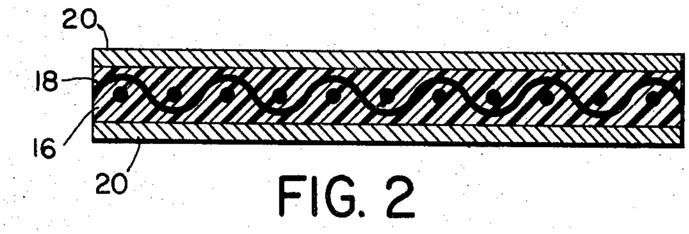
FIG. 2
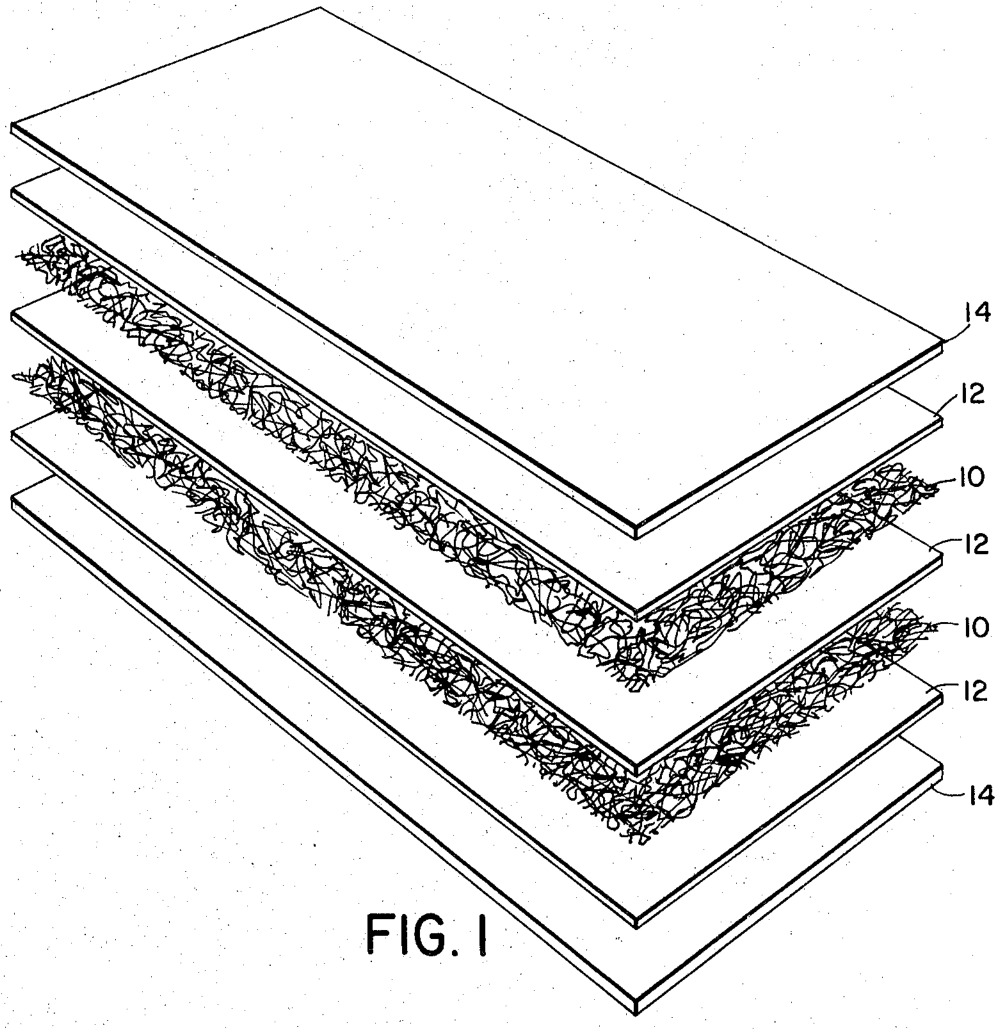
FIG. I
INVENTOR
LOUIS F. ROSSETTI
BY Francis D. Thornton
ATTORNEY

United States Patent Office 3,558,423

Patented Jan. 26, 1971

3,558,423

LOW LOSS ELECTRICAL PRINTED CIRCUIT BOARD COMPRISING POLYOLEFIN, FIBER-GLASS AND METALLIC FOIL

Louis F. Rossetti, Jr., Arlington, Mass., assignor to Electronized Chemicals Corp., Burlington, Mass., a corporation of Delaware Filed Oct. 16, 1967, Ser. No. 675,523
Int. Cl. B32b *15/08, 17/10;* C09j *5/00*
U.S. Cl. 161—203 4 Claims

ABSTRACT OF THE DISCLOSURE

This disclosure describes an inexpensive, low loss, high temperature resistant, easily fabricated, polyethylene-fiberglass, dielectric material suitable for use in microwave frequency communication devices and the process for making the same. This material may be fabricated so as to be useful as printed circuit boards, strip transmission lines, insulating components and the like.

BACKGROUND OF THE INVENTION

Dielectric boards are well known and widely used by the electrical and electronics industry. In general, such boards consist of a dielectric material, plastic, paper or the like, and may be clad with conductive matter that can be etched into desired configurations and used as printed circuit boards, strip transmission lines and the like.

Where electrical loss of radio frequency (RF) energy is not important, there are the common phenolic-paper (Nema grades XXP, XXXPC, PR–2, etc.) as well as epoxy FR3, nylon fabric-phenolic (Nema N–1) and several others. Each of these varies in usefulness depending upon cost, dielectric constant and maximum operating temperature. Thus these materials are useful in low frequency circuits even though they may vary in dielectric strength and arc resistance.

As the operating frequency is increased, RF energy becomes absorbed in the dielectric material resulting in increased loss and signal attenuation. Recently with the trend toward compact microwave circuits in radar and other microwave devices there has been a need for a dielectric material of the lowest electrical loss in terms of dissipation factor or loss tangent. The available materials are limited in electrical properties at microwave frequency. Presently Teflon-fiberglass (Nema grade GT and GP), styrene, styrene-fiberglass, polyethylene, polyphenylene oxide, polyester, and polyamides are somewhat useful microwave dielectrics. Each of these materials has, however, serious limitations which mitigate against their wide use in microwave devices.

For example: Teflon-fiberglass has a dissipation factor of 0.001 at 1 megacycle and at $10^9$ cycles/second. The material is somewhat non-uniform and non-homogeneous in manufacture due to the inherent difficulties in Teflon impregnation of fiberglass and is very expensive, on the order of $20–30/square foot.

Styrene and styrene-fiberglass are difficult to manufacture into a homogeneous board due to the unusual character of the polymerization process. The divinyl benzene-styrene ratio, catalyst, moisture and cure time are critical in making good styrene dielectric material. In addition the material has a dissipation factor of 0.001 at 1 megacycle and at $8.5 \times 10^9$ cycles/second. In manufacture the dielectric material frequently has a dissipation factor several times higher owing to the aforementioned process parameter interdependence. Styrene boards are difficult to machine although fiberglass reinforcement tends to minimize this.

Polyphenylene oxide (PPO) is a uniform dielectric with much the same electrical properties as Teflon-fiberglass. The dielectric constant is 2.55 and the dissipation factor is 0.0009 at $10^8$ cycles/second and 0.001 at $10^9$ cycles/second. The dielectric material is difficult to shear and etch in common Lewis acid etchants such as ferric chloride. Moreover when using these ferric chloride etchants the material is commonly treated with an organic solvent which causes a surface stress crack to develop over the entire surface. Other etching and wash systems are available but are considerably more costly. Boards made of this material are quite costly at approximately $30 square foot.

Polyesters offer limited electrical properties at microwave frequencies. The dielectric constant is 3.5 typically and the dissipation factor is considerably higher than Teflon-fiberglass at 0.005 at 1 megacycle and $10^8$ cycles/second. Moreover polyesters have a dissipation factor closer to 0.01 at $10^9$ cycles per second. The material is tough and flexible and is used for low frequency flexible flat cables rather than for microwave devices.

Polyamides of several varieties, crosslinked or not, are quite lossy. The dielectric constant is typically 3.5 to 4.0 with a dissipation factor of 0.004 at best and 0.014 in the lossiest material at 1 megacycle. Although the polyamides are as tough and flexible as some polyesters and have somewhat improved high temperature properties, their lossiness restricts their use to lower frequency applications.

Polyethylene has the most desirable electrical properties in a homogeneous, uniform dielectric material. However when used for printed circuit board manufacture the material's normal physical properties are unsuitable. The high laminating temperature required for successful foil cladding results in excessive dielectric flow. However crosslinking of the polyethylene permits the material to withstand the cladding process temperatures.

Crosslinking may be accomplished in several ways. The most common two are: (1) catalyst and heat and (2) high energy electron or gamma irradiation. The former leaves a non-homogeneous, variable dielectric property material while the latter produces a uniform, homogeneous material with excellent dielectric properties. The dielectric constant of irradiated polyethylene is 2.3 to $10^{10}$ cycles/second and 0.001 dissipation factor from $10^6$ to $10^{10}$ cycles/second. Typical dissipation values range as low as 0.00002 to $10^{10}$ cycles/second. As a finished clad circuit board the irradiated dielectric offers excellent electrical properties but still has limited physical properties. Typical material of this sort has an upper operating temperature of 165° F. At temperatures of 158° F. (70° C.) the material, after etching copper from both sides, shrinks. (5 mils/inch maximum; 3 mils/inch typical.)

Therefore a dielectric material for use at microwave frequencies requires, in addition to good electrical properties, certain physical and chemical properties. The electrical properties of polyethylene have been shown to be adequate. However the thermal stability, flexibility, tensile strength, elongation factor, and solvent resistance of the pure polyethylene or cross-linked polyethylene do not provide the most stable dielectric material for use at microwave frequencies.

The present invention provides a dielectric material useful as a printed circuit board or the like which has all the excellent electrical properties at microwave frequencies of polyethylene and which avoid its poor physical properties.

SUMMARY OF THE INVENTION

The present invention comprises a dielectric for use at at microwave frequencies through at least the Ka band (approximately 20 kmcs.), which consists of irradiated crosslinked polyethelene and fiberglass. Circuit boards produced by utilizing the present invention retain substantially all the desirable electrical characteristics of the prior art polyethylene boards while avoiding the limited physical properties of such boards.

Generally the circuit boards produced using the present invention have a high dielectric homogeneity, low loss at microwave frequencies, negligible thickness variation, high temperature resistance (to 265° F.), high mechanical strength, high peel strength, batch to batch process uniformity, and little shrinkage after etching. Additionally the circuit boards of the present invention are flat, inert to the common solvents and solutions used in printed circuit fabrication, easily and accurately machined, punched or drilled, and have long term stability of electrical, physical, and mechanical characteristics and are assembled without the use of adhesives.

DESCRIPTION OF THE DRAWING

FIG. 1 shows an exploded view of the component parts of one embodiment of the invention.

FIG. 2 shows a cross sectional view of a completed printed circuit board of the present invention.

DESCRIPTION OF THE PREFERRED EMBODIMENT

Referring now to FIG. 1, the invention comprises a laminate of sheets of fiberglass matting 10, polyethylene sheets 12 and metal foils 14.

The fiberglass matting 10 is a 7 mil thick fiberglass or silica mat formed by matting a loose roving of fiberglass with chemical binders. Such mats are readily commercially available from many industrial sources. In addition, glass cloth woven in various fabric weaves (plain, satin, etc.) and thread denier may be employed and will provide maximum strength and minimum dimensional change. A printed circuit board employing such a fiberglass woven cloth as its spine is shown in FIG. 2. Here the irradiated polyethylene 16 is shown fuzed around the glass cloth 18 and clad with copper or aluminum foil 20. The many forms of glass fabric and mattings available may use one of the following resin binders: polyesters. starch, chrome complexing agents, silanes and vinyl silanes or several combinations of the aforementioned. It is preferred in practising this invention that the fiberglass fabric or mat used be referred to as No. 112 finish or binder removed finish. No. 112 finish fabrics or mats have binder residue reduced to a minimum by high temperature exposure for a specified period of time. In the event that fabrics or mats so treated are not used, polyester or silane binders are acceptable.

The polyethylene sheets 12 are identical and are typically 10 mils thick although other thicknesses may be chosen to affect the physical properties desired in the finished product. The polyethylene lease material used is chosen for its maximum physical and superior electrical properties. The preferred polyethylene resin material is known as extrusion grade cable resin and is available from many manufacturers. Those materials falling into the category of suitable base stock are high density, low melt index, high molecular weight, low antioxidant content polyethylenes, As an example materials meeting ASTMD–1248 Type III materials would fall into this category. With a 0.1% stable antioxidant, this material forms an excellent base free of any other additives such as slip agents (fatty acid amides) which cause electrical property change or clay fillers which alter the physical properties.

The metal foil 14 is typically circuit board treated copper foil referred to in MIL-p-13949D "Printed Sheet, Laminated, Copper Clad." These foils have one side oxidized or otherwise specially treated to permit bonding to polyethylene. Such material is available from several manufacturers. Other metal foils such as aluminum or Nichrome, can also be used.

The process of the present invention for making such circuit boards, comprises first selecting sheets of polyethylene, as described above, and then irradiating them with high energy electrons. Electrons of sufficient energy to penetrate the selected films is necessary, that is, for the described sheets 12, any energy greater than 250 kev. The dosage should be in the order of 1 to 50 megarads depending upon processing conditions such as speed etc. and can be readily determined by one skilled in the art of radiation processing. For the described polyethylene sheets a 5 megarad dose is sufficient for processing and achieving stability in the completed product. Radiation processing of polyethylene is known to the art and alters certain basic physical characteristics of the material by crosslinking as described by Brasch in U.S. Pat. No. 2,981,668. Required electron doses may be provided by any of a number of high energy electron accelerators. Gamma ray sources although capable of promoting crosslinking are expensive and require excessive exposure times to achieve the required dose and therefore are not recommended.

Following irradiation of the polyethylene sheets a dielectric board is fabricated by forming the fiberglass fabric and irradiated polyethylene sheets into an alternating layer matrix. For a circuit board 1/16" thick, six sheets of 10 mil polyethylene and five sheets of fiberglass are used. The matrix is placed in an industrial multiple opening platen press and subjected to heat and pressure. Exposure time, temperature and pressure are all variable.

Typically a pressure of 300 p.s.i. and a temperature of 350° F. is applied for ten minutes when using polyethylene sheets irradiated at a dose of 5 megarads.

The practical limiting values of temperature, pressure and time for such a matrix is of the following order: (1) 200–400 p.s.i., (2) 300–450° F., (3) 5 to 30 minutes when using 1 to 50 megarad dose irradiated polyethylene. At the end of ten minutes the press is cooled while maintaining the selected pressure. When room temperature (72° F.) is reached the pressure is released and the unified matrix removed from the press.

Both faces of the matrix are machined to the close tolerance needed in microwave devices. This is accomplished by securing the matrix in a vacuum operating holding jig while a commercial diamond point fly cutting grinder is deployed across the face of the matrix. Tolerances of ±0.001 inch can be achieved. The board so produced is now useful for microwave work as insulator spacers and the like. If it is desired that such a board be prepared for printed circuit work, aluminum or copper foils, as described above, are selected and placed on either side of the matrix with the treated or oxidized side facing the matrix. The entire laminate consisting of foil, irradiated polyethylene-fiberglass, foil is placed once again in the laminating press and subjected again to heat and pressure for a specified length of time. Exposure characteristics for the 1/16" example are again 300 p.s.i. pressure, 350° F. temperature, and 10 minutes exposure time. The practical limits for this operation are again (1) 200–400 p.s.i., (2) 300–450° F., and (3) 5 to 30 minutes exposure. Again after the designated time has elapsed the press is cooled to room temperature while maintaining the selected pressure. At room temperature the pressure is released and the copper clad dielectric material removed from the press.

The unit is now adaptable for use as a printed circuit board. If the circuit board is used at this time, removal of the foil by etching or stripping to form the printed circuit would result in warping or twisting of the board, causing it to be unsuitable for use at microwave frequencies. To eliminate this twist or warp the board is first stabilized before etching by exposure to both low and high temperature which relieves the stresses within the laminate. The foil clad laminate of our 1/16" example is subjected to —320° F. for four minutes and then allowed to warm slowly to room temperature. Upon reaching room temperature the board is again cooled to about —320° F. and again permitted to warm to room temperature after which it is then heated to approximately 40° C. (104° F.) for 20 minutes. The resulting foil clad laminate is then stable and useful in microwave printed circuitry. The foil may be removed from one side of the board treated thereby without any twisting, warping or other physical deformation. As examples of dimensional change, shrinkage after 1 hour exposure at 100° C. (212° F.) and warp of materials with and without glass loading the following table is presented:

TABLE I

| | Dimensional change, inch/inch | |
|---|---|---|
| A. Irradiated polyethylene 1/16", no glass load, stabilized | ±0.001 | ±0.005 |
| B. Irradiated polyethylene 1/16", with surfacing mat, stabilized | ±0.0008 | ±0.0016 |
| C. Irradiated polyethylene, 1/16", with style No. 181 glass cloth (stabilized) | ±0.0002 | ±0.0004 |
| D. Irradiated polyethylene, 1/16", with surfacing mat and no stabilization | ±0.002 | ±0.005 |

Warp follows 3×difference for no stabilization versus stabilization in glass filled boards only. Warp difference is greater in unfilled boards.

Stabilization of the boards of the invention may be realized at many temperatures for a number of different exposure times. Limits based upon dimensional change, shrinkage and warpage testing are as follows: (1) low temperature may be any temperature below (0° C.=32° F.), although the range of —70° F. to —320° F. is preferred (2) high temperature may be any temperature above (33.3° C.=92° F.) but less than the press cycle temperature, (3) Exposure time is variable from several seconds to ten minutes at low temperature and several seconds to several hours at high temperature.

For thinner or thicker boards than the example of 1/16" different stabilization cycles are used based upon minimum values for dimensional change, warp and shrinkage. In general, for boards of other thicknesses, the number of low temperature exposures is inversely proportional to the thickness of the board when the heating step, above room temperature remains constant. A table of the most useful thickness and the number of low temperature exposures required is given below.

TABLE II

| | Number of low temp. exposures | Number of heat treatments |
|---|---|---|
| Thickness: | | |
| 1/32 inch | 4 | 1 |
| 1/16 inch | 2 | 1 |
| 1/8 inch | 1 | 1 |

For thickness greater than 1/8" the number of low temperature exposures and heat treatments remain constant.

Printed circuit boards produced by this technique have at least the following electrical and physical characteristics and properties when tested as indicated in the listed test method section.

GENERAL PROPERTIES

| | Value | | Test method, section |
|---|---|---|---|
| A. Substrate: | | | |
| Tensile | 3,800 p.s.i. min. Clad or unclad | | 1.1 |
| Elongation, percent | 5% (max.) | | 1.2 |
| Density | 1.02 | | 1.3 |
| Elastic modulus at 150° C | 8,000 p.s.i. (1.16" mat.), average | | 1.4 |
| Dielectric strength | 1,400 v./mil | | 1.5 |
| Volume resistivity | $10^{15}$ ohms (min.) | | 1.6 |
| Surface resistivity | $10^{14}$ ohms (min.) | | 1.7 |
| Water absorption | 0.1% | | 1.8 |
| Hardness | 63-73 (Shore D) | | 1.9 |
| Radiation resistance | Excellent. GF-265 is resistant to electron, beta, X-ray, gamma, positive ion and neutron radiation fields. The substrate will maintain properties to a dose of $10^9$ rads electron at Van Allen belt dose rates and in mixed fields to greater than $10^{19}$ *nvt*. | | |
| Chemical resistance | Weak acid, very resistant; strong acid, attacked slowly by oxidizing agents; weak alkali; very resistant; strong alkali; very resistant; organic solvents, resistant at less than 90° C. | | |
| B. Laminate: | | | |
| Copper foil purity | 99.5% min | | 2.1 |
| Copper foil resistivity | 0.15940 ohms-gms./m.$^2$ | | 2.2 |
| Peel strength electrodeposited copper | | | 2.3 |
| At 25° C | 6 lbs./in. | | |
| At 130° C | 2 lbs./in. | | |
| After one hour at 130° C. | 5 lbs./in. | | |
| Dimensional change | One side etch | Two side etch | 2.4 |
| 1/32" GF-265 | ±0.5 mil/in | 0.5 mil/in. | |
| 1/16" GF-265 | ±0.5 mil/in | 0.8 mil/in. | |
| 1/8" GF-265 | ±0.2 mil/in | 0.2 mil/in. | |
| Shrinkage | Two side etch | | 2.5 |
| 1/32" GF-265 | ±0.6 mil/in. | | |
| 1/16" GF-265 | ±1.6 mil/in. | | |
| 1/8" GF-265 | ±0.8 mil/in. | | |
| Warpage | | | 2.6 |
| 1/32" GF-265 | ±5.0% | | |
| 1/16" GF-265 | ±1.0% | | |
| 1/8" GF-265 | ±1.0% | | |
| C. Electrical: | | | |
| Dielectric constant | 2.42±0.01 from 1 mcs. to 10,000 mcs., clad or unclad | | 2.7 |
| Dissipation factor | 0.008±0.00005 at 1 mcs | | 2.8 |
| Attenuation | 0.2 db./ft. for 50 ohm line at 1,300 mcs | | |
| D. Miscellaneous: | | | |
| Solder dip resistance | Will not delaminate | | 3.1 |
| Machinability | Will not alter properties | | 3.2 |
| Thickness variation | ±0.002" max. total thickness variation sheet-to-sheet for clad material. ±0.001" over full face of any given clad sheet. At least 90% of the area of a sheet is within the tolerances given, and at no point does the thickness vary from the nominal by a value greater than 125% of the specified tolerance. Special tolerances are available on custom order for clad sheets. | | 3.3 |

(5) Test methods:

5.1.1 Tensile strength: Tested in accordance with ASTM D-38 (ASTM D412 size "C" die) or Federal Standards No. 406 (1011) determined at a crosshead speed of 20 inches/minute is 3800 p.s.i. minimum, clad or unclad.

5.1.2 Elongation: Tested in accordance with ASTM D638 (ASTM D412 size "C" die) or Federal Standard No. 406 (1011) determined at a crosshead speed of 2 inches/minute is 5% maximum.

5.1.3 Density: The density is 1.02 on substrate which has its copper removed. It is tested in accordance with ASTM D792-60T utilizing Method A.

5.1.4 Elastic modulus: Tested in accordance with ASTM D638 determined at a crosshead speed of 0.2 inches/minute on a specimen 4" x 0.5" x sample thickness at a temperature of 150±1° C. is 8000 p.s.i. average.

5.1.5 Dielectric strength: The dielectric strength of the substrate is 1400 volts/mil. when tested according to ASTM D149 on a 1/32" sample at 0.5 kv. rate of rise step-by-step voltage application.

5.1.6 Surface resistivity: Tested according to ASTM D257, the surface resistivity of the substrate is $10^{14}$ minimum.

5.1.7 Volume resistivity: The volume resistivity of the substrate is $10^{15}$ ohms when tested according to ASTM D257.

5.1.8 Water absorption: The water absorption of the substrate is less than 0.1% when tested according to ASTM D570 for 24 hour immersion.

5.1.9 Hardness: Tested according to ASTM D1706, the substrate has a hardness range of 63–73 on the Shore "D" scale.

5.2.1 Copper foil purity: The copper foil has a minimum purity of 99.5% when tested according to MIL-P-13949D, Section 3.2.2.

5.2.2 Copper foil resistivity: The maximum resistivity of the copper foil is 15,940 ohm grams per meter squared when measured at 20° C. according to MIL-P-13949D, Section 3.2.2.

5.2.3 Peel strength: A piece of Polyguide GF-265 1" x 7" is cut from a sheet. One-half inch of copper is stripped from one end. The copper foil is clamped in a tensile testing device such that the copper is peeled constantly at 90° from the substrate surface at a speed of 1±0.1 inch per minute. The line of peel is normal to the width of the strip.

5.2.5 Dimensional change: The dimensional change in mils/inch is determined as follows: A piece of Polyguide GF-265 1" x 5" is cut from a sheet. One line 3/16" from one end is scribed on both copper foil sides. The distance between the end and scribe line is measured to the nearest 0.0001 inch. Copper is removed from one side by etching in 44% Ferric Chloride etch solution maintained at room temperature. The etched piece is then rinsed with 60–90° F. water and dried by air or wiping. The distance between the end and the scribed line is then measured to the nearest 0.0001 inch. Dimensional change$=L_0-L_1$, where $L_0$ is the original distance between scribe line and end, and $L_1$ is measured after etch. The etching procedure is repeated for the second line.

5.2.5 Shrinkage: The shrinkage in mils/inch is determined as follows: The unclad strip of section 5.2.4 is heated in an oven maintained at 100° C. for one hour. The piece is then cooled to room temperature and the distance between the scribe line and end is measured. Shrinkage equals $L_0-L_2$, where $L_0$ is the original distance between scribe line and end (same as section 5.2.4) and $L_2$ is the distance measured after a heat cycle.

5.2.6 Warpage: A piece of Polyguide GF-265 1" x 5" is cut from a sheet. The flatness of the piece is measured by "feeler" gauge or ruler at the midpoint of the 5" side. The copper is then etched according to 5.2.4 and the sample is air dried. The flatness is re-measured and warpage is calculated as follows: 0/0 Warp=Final distance at midpoint—initial distance at midpoint X100.

5.2.7 Dielectric constant: The dielectric constant of Polyguide GF-265 is 2.42±0.01 at 1 mc. when tested according to ASTM D1531. A Boonton Radio Corp. 260A "Q" meter (or equivalent) is used with a coil having a "Q" of 500–625 and a benzene cell containing ACS reagent grade benzene, or silicone oil—Dow Corning DC-200 viscosity, 1 centistoke. Dielectric constant at 1300 mcs. is 2.42±0.01 when performed by the filter technique described in the Quality Assurance Section of our Polyguide Manual.

5.2.8 Dissipation factor: When tested according to ASTM D1531 and modified as in section 5.2.7 the value is 0.0008±0.00005. This value is calculated as follows:

$$D_p=\frac{C_o\Delta Q}{K_pCaQ_1Q_2}\left(\frac{ta}{ts}\right)$$

Where:

$D_p$=dissipation factor of specimen
$C_o$=measuring circuit capacitance
$\Delta Q$=measured with and without benzene or silicone oil as in 5.2.7
$K_p$=dielectric constant from section 5.2.7
Ca=2 x 0.2249A/ta
$Q_1$="Q" benzene or silicone oil as in 5.2.7
$Q_2$="Q" benzene or silicone oil as in 5.2.7 plus specimen
$ta$=separation of capacitor plates in inches
$ts$=thickness of specimen, in inches
A=area of center capacitor plate in square inches (one face)

5.3.1 Solder dip resistance: A piece of material is cut from a sheet of Polyguide GF-265 to a dimension of 1" x 1". The end of the strip is immersed for 10 seconds in a 60/40 solder bath maintained at 450° F. (232° C.). Upon removal, the strip is allowed to cool to room temperature. The copper foil will not delaminate.

5.3.2 Machinability: Shearing the sheets is recommended as the best way of cutting for thicknesses below 1/4". Band saw cutting is recommended for 1/4" and thicker sheets. For punching, drilling or turning, follow standards adopted for machining of polyethylene sheets. The process of machining sheets does not alter the properties in section 4.0.

5.3.3 Thickness variation: Thickness variation of each manufactured sheet of Polyguide GF-265 is measured by use of a deep throated air micrometer which allows accurate dimensional measurement over the full face of the sheet. Air micrometer thickness testing has been adopted for Polyguide GF-265 because it allows continuous measurement over the full face of the manufactured sheet.

In the event that unclad boards are to be used in conjunction with temperature stabilized, clad boards, it is necessary for electrical and mechanical matching that these boards be produced in an identical manner and be subjected to the same low temperature exposures and heat treatment as the equivalent thickness clad board.

In addition to the fiber glass matting and weaving described, it is also possible to use other materials for loading the polyolefin such as glass dust, glass beads, glass microballons, dacron matting, dacron weaving, dacron fibers or acrylic mats, weaves, fibers etc. In fact it may be possible to use any number of solid insulative materials which have a resistivity between $10^{10}$ and $10^{19}$ ohm-cm.

Having now described the invention, a method of making it, and some of its end uses in detail, it is desired that the invention herein set forth not be limited by the given examples but only by the following claims:

I claim:

1. A temperature stabilized dielectric body having minimal warpage, shrinkage and dimensional change comprising a mass of irradiated crosslinked crystalline, high density, high molecular weight, solid polymer or copolymer of one or more monomeric olefins having a flow temperature above 500° F. fused to a high dielectric, high melting point fiberglass material, having a resistivity between $10^{10}$ and $10^{19}$ ohm-cm., said body having an elastic modulus at 150° C. of about 8000 p.s.i., a dimensional change of less than 0.8 mil per inch, a shrinkage of less than 1.6 mils per inch, a warpage of less than 5%, a dielectric constant between 2.2 and 4.0 from 1 mcs. to 10,000 mcs., a dissipation factor between 0.000025 and 0.001 at 1 mc., resistance to weak acids, alkaline and organic solvents heated to 90° C. or less, a planar surface, metallic foil affixed to a portion of said surface, and being substantially stress free.

2. The body of claim 1 being in the form of a board having a pair of planar, substantially parallel surfaces and metallic foil affixed to both of said surfaces.

3. The board of claim 2 wherein the metallic foil on one surface differs from that on the other surface.

4. The method of making a dimensionally stable dielectric circuit board having low losses at frequencies between 1 mc. and 20,000 mcs. which method comprises forming a matrix of a crystalline, high density, high molecular weight monomeric olefin with fiberglass solids having a resistivity between $10^{10}$ and $10^{19}$ ohm-cm., subjecting said matrix to heat and pressure to form a unified board, having a pair of planar substantially parallel surfaces cladding each of said surfaces with a metallic foil, subjecting said clad board to a temperature in the range of −70° F. to −320° F. and heat treating said clad board at a temperature in the range of 92° F. to 450° F. to render said board substantially stress free and fix the dimensional stability of said board at not greater than 0.2 mil/inch with a warpage of less than 10%.

References Cited

UNITED STATES PATENTS

| | | | |
|---|---|---|---|
| 2,919,473 | 1/1960 | Cole | 161—412X |
| 2,963,538 | 12/1960 | Dahlgren | 174—117 |
| 2,994,059 | 7/1961 | Dahlgren et al. | 339—188 |
| 2,964,436 | 12/1960 | Mikulis et al. | 156—3X |
| 3,000,772 | 9/1961 | Lunn | 161—203X |
| 3,274,328 | 9/1966 | Davis | 161—412X |
| 3,318,758 | 5/1967 | Tell | 156—272X |
| 3,340,606 | 9/1967 | Anderson et al. | 29—625 |
| 3,466,360 | 9/1969 | Chipman | 264—346X |

JOHN T. GOOLKASIAN, Primary Examiner

D. J. FRITSCH, Assistant Examiner

U.S. Cl. X.R.

161—93, 141, 216; 156—306, 311